(12) United States Patent
Nguyen et al.

(10) Patent No.: US 7,875,996 B2
(45) Date of Patent: *Jan. 25, 2011

(54) MULTI-REGULATOR POWER DELIVERY SYSTEM FOR ASIC CORES

(75) Inventors: Daniel P. Nguyen, Campbell, CA (US); Steve X. Chi, Cupertino, CA (US); Po-Shen Lai, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 377 days.

This patent is subject to a terminal disclaimer.

(21) Appl. No.: 12/005,144

(22) Filed: Dec. 21, 2007

(65) Prior Publication Data

US 2009/0160421 A1   Jun. 25, 2009

(51) Int. Cl.
  *H02J 1/00* (2006.01)
  *H02J 3/00* (2006.01)
(52) U.S. Cl. ...................................................... 307/80
(58) Field of Classification Search .................. 307/80, 307/82, 85
  See application file for complete search history.

(56) References Cited

U.S. PATENT DOCUMENTS

| | | |
|---|---|---|
| 6,654,263 B2 | 11/2003 | Kurotsu |
| 6,654,264 B2 | 11/2003 | Rose |
| 6,950,896 B2 | 9/2005 | Scordalakes et al. |
| 7,058,373 B2 | 6/2006 | Grigore |
| 2005/0213268 A1* | 9/2005 | Cetin et al. ................... 361/18 |
| 2006/0244482 A1 | 11/2006 | Peterson et al. |
| 2006/0270366 A1 | 11/2006 | Rozenblit et al. |
| 2007/0018621 A1 | 1/2007 | Mok et al. |
| 2007/0114981 A1 | 5/2007 | Vasquez et al. |

OTHER PUBLICATIONS

International Search Report for application No. PCT/US2008/083958 issued May 22, 2009 (3 pages).
Written Opinion for application No. PCT/US2008/083958 issued May 22, 2009 (4 pages).
George Patounakis et al. "A fully integrated on-chip DC-DC conversion and power management system" IEEE Journal of Solid-State, vol. 39, No. 3, pp. 443-451, Mar. 2004 (9 pages).
Ka Nang Leung et al. "A capacitor-free CMOS low-dropout regulator with damping-factor-control frequency compensation" IEEE Journal of Solid-State, vol. 38, No. 10, pp. 1691-1702, Oct. 2003 (12 pages).
U.S. Appl. No. 12/005,124 entitled, "Multi-Regulator Power Delivery System for ASIC Cores", filed Dec. 21, 2007, 26 pages.

(Continued)

*Primary Examiner*—Jared J Fureman
*Assistant Examiner*—Carlos Amaya
(74) *Attorney, Agent, or Firm*—Brinks Hofer Gilson & Lione

(57) ABSTRACT

An electronic product includes an application specific semiconductor chip (ASIC) device which includes in its circuitry both a linear regulator module configured to be coupled to an optional external capacitance and a capless regulator module configured to be coupled to internal capacitance of the electronic product. Control logic of the ASIC device is responsive to a regulator selection signal for selecting one of the linear regulator module and the capless regulator module for use in powering the ASIC device. The control logic may select the linear regulator module for certain times of operation and the capless regulator module for other times of operation.

51 Claims, 2 Drawing Sheets

OTHER PUBLICATIONS

Hazucha, P. et al., "Area-Efficient Linear Regulator With Ultra-Fast Load Regulation", *IEEE Journal of Solid-State Circuits,* vol. 40, No. 4, pp. 933-940, Apr. 2005.

U.S. Office Action dated Jan. 21, 2010, directed against U.S. Appl. No. 12/005,124, (6 pages).

* cited by examiner

MULTI-REGULATOR POWER DELIVERY SYSTEM FOR ASIC CORES

STATEMENT OF RELATED APPLICATIONS

The present application may be considered to be related to co-pending U.S. patent application Ser. No. 12/005,124 filed on even date herewith, in the name of inventors Daniel P. Nguyen, Steve X. Chi and Po-Shen Lai, entitled "Multi-Regulator Power Delivery System for ASIC Cores", commonly owned herewith.

TECHNICAL FIELD

The present disclosure relates generally to an ASIC core or similar electronic circuit that can be powered by various power regulator technologies depending upon the actual application in which it is used.

BACKGROUND

An ASIC (Application Specific Integrated Circuit) is a semiconductor device designed for a particular application. ASICs may include virtually any collection of circuits known. For example, they are used in consumer memory devices such as those used with cameras, music players, navigation devices and the like. They are also used in many other types of electronic devices and may be highly specialized to a particular task or set of tasks.

An ASIC core is a defined function to be performed by circuitry which has been designed and verified as a standalone entity and is available in an ASIC function library for a particular process technology. Each ASIC core is an element whose performance and function are understood and which can be, essentially, used as a building block in constructing an ASIC chip design. An ASIC core may be implemented as a function plus a predefined physical layout or standard cell, a function plus a physical layout to be implemented by the ASIC vendor, or as a function embodied in a standard technology-dependent gate-level net list to be fully integrated by the customer.

ASIC cores, when implemented as real circuits, require regulated power in order to operate. Typically they are powered by one of the available various regulator technologies depending upon the needs of the circuit. For example, for applications requiring extremely low quiescent and active operating current but which can tolerate the use of an external (i.e., relatively large) capacitor, a linear (e.g., low dropout (LDO)) regulator is highly suitable. Such an approach is used, for example, in micro secure digital (SD) memory cards and is illustrated in block diagram form in FIG. 1. On the other and, if board space (or other physical space) is at a premium and higher quiescent and active operating currents are tolerable, then a capless regulator having no external capacitor may be a better solution. This situation is often encountered in high-end memory card applications (e.g., Memory Stick-type Flash memory cards, and the like) and is illustrated in block diagram form in FIG. 2.

The design, validation and construction of ASIC chips represents a significant investment for an electronic product manufacturer. It would be desirable to reduce such costs to the extent possible.

Overview

An electronic product includes an application specific semiconductor circuit (ASIC) device which includes in its circuitry both a linear regulator module configured to be coupled to an optional external capacitance and a capless regulator module coupled to internal capacitance of the electronic product. Control logic of the ASIC device is responsive to a regulator selection signal for selecting one of the linear regulator module and the capless regulator module for use in powering the ASIC device. The control logic may select the linear regulator module for certain times of operation and the capless regulator module for other times of operation or it may select one or the other for all times of operation.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of an electronic product including an ASIC device. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines, e.g., in a controller of a non-volatile memory device. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, and the like), magnetic storage medium (e.g., tape, magnetic disk drive, and the like), optical storage medium (e.g., CD-ROM, DVD-ROM, paper card, paper tape and the like) and other types of program memory.

Figure 3:
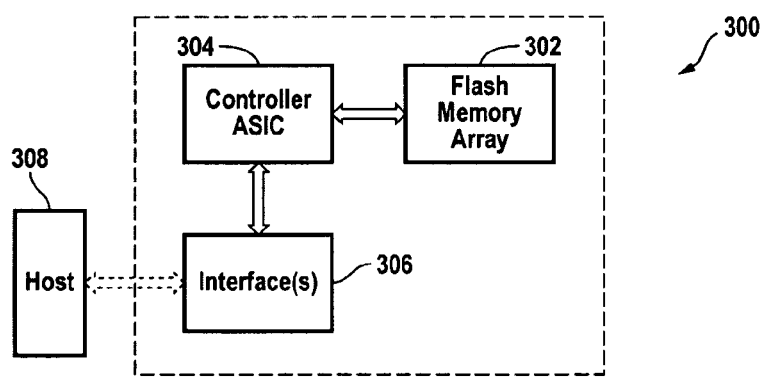
FIG. 3 is a schematic block diagram of an example memory device including a flash memory array, a controller ASIC device and interface(s) to a host device.

In accordance with one example embodiment, the invention may be used in a memory device useable with consumer electronic equipment such as computers, digital cameras, digital music players, navigation equipment, communications equipment, and the like. It may also be employed in other electronic products as will now be apparent to those of ordinary skill in the art. FIG. 3 illustrates a typical system block diagram of such a memory device. In the example memory device 300 of FIG. 3 a flash memory array 302 is controlled by a controller device 304 implemented as an ASIC device. Interface circuitry 306 is coupled to the controller 304 and provides connectivity to conventional host devices 308 to which memory device 300 may be coupled.

Figure 1:
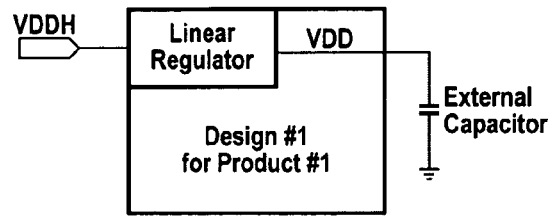
FIG. 1 is a schematic block diagram for a first electronic product powered by a linear voltage regulator employing an external (relatively large) capacitance in accordance with the known art.
Figure 2:
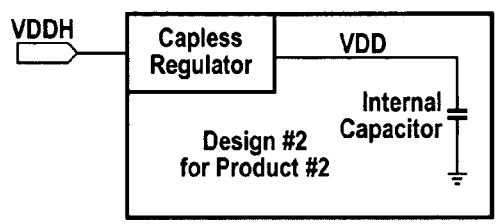
FIG. 2 is a schematic block diagram for a second electronic product powered by a linear voltage regulator employing an internal (relatively small) capacitance in accordance with the known art.

In the example memory device context, controller 304 is typically powered by an external device, such as the host device 308 and includes power supply circuitry such as that illustrated in FIGS. 1 and 2 in order to condition electrical power provided for use by its circuitry.

Figure 4:
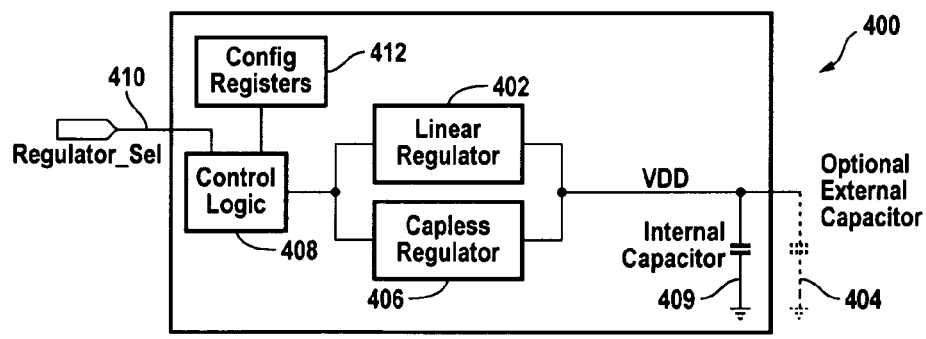
FIG. 4 is a schematic block diagram for a power supply portion of a third electronic product selectively powerable by a linear regulator module or a capless regulator module in accordance with one embodiment.

Turning now to FIG. 4, in accordance with one embodiment, a power circuit 400 including a linear regulator module 402 (which requires coupling to an external-to-the-ASIC capacitor 404 of relatively high capacitance (on the order of one or more microfarads of capacitance)) as well as a "capless" regulator module 406 (which requires no external capacitor and makes do with a very small discrete decoupling capacitor or with the capacitance inherent in the circuitry of the ASIC 408 (on the order of a half to a few nanofarads of capacitance)) both provided on the ASIC. An ASIC built in accordance with this concept may now be used in more than one application and the costs of development of the ASIC may be spread over a much larger potential market. For example, one ASIC may be used to build memory devices compatible with the micro SD standard as well as memory devices compatible with the Memory Stick standard even though such disparate devices would use different capacitor arrangements. External capacitors may be employed, or not, as required by the electrical design, without any need to do more than tell the controller ASIC 304.

So called "capless" regulators are well known in the art. For example, an integrated linear regulator using only a 0.6 nF decoupling capacitor is described in detail in Hazucha et al., *Area-Efficient Linear Regulator With Ultra-Fast Load Regulation*, IEEE Journal of Solid State Circuits, Vol. 40, No. 4 (April, 2005). Such circuits use extremely small capacitance—either provided by discrete but low-valued capacitors integrated onto the semiconductor die along with the rest of the regulator circuitry or the inherent parasitic capacitance of that circuitry. Typically these capacitances range from roughly 0.5 nF to a few nF.

Figure 5:
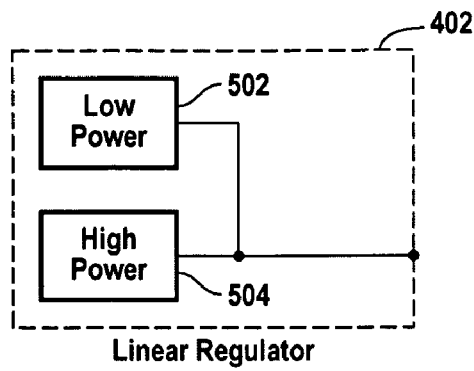
FIG. 5 is a schematic block diagram of a linear regulator module in accordance with one embodiment.

Linear regulator module 402 is depicted in some more detail in FIG. 5 where it is illustrated to comprise a low-power sub-module 502 (for providing relatively low power in a standby mode, for example) and a high-power sub-module 504 (for providing relatively high power in a regular operating mode). In one example embodiment the low-power sub-module may provide electrical current up to about 5 mA and the high-power sub-module may provide electrical current up to about 100 mA. One is typically selected for use at a time, or the low-power module may be left on at all times and supplemented by the high-power sub-module when required.

Figure 6:
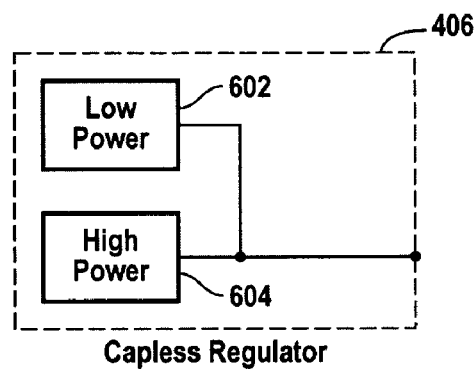
FIG. 6 is a schematic block diagram of a capless regulator module in accordance with one embodiment.

Capless regulator module 406 is depicted in some more detail in FIG. 6 where it is illustrated to comprise a low-power sub-module 602 (for providing relatively low power in a standby mode, for example) and a high-power sub-module 604 (for providing relatively high power in a regular operating mode). In one example embodiment the low-power sub-module may provide electrical current up to about 5 mA and the high-power sub-module may provide electrical current up to about 100 mA. One is typically selected for use at a time, or the low power module may be left on at all times and supplemented by the high-power sub-module when required.

Selecting which regulator to use is performed as discussed below. In one embodiment the controller may be configured to always select the low-power sub-module 602 of the capless regulator 406 for initial power-up. Then additional control logic selects the linear or capless regulator module for operations following initial power-up. In another embodiment the controller may be configured to select one of the linear or capless regulator modules for initial power-up based upon a configuration pin (e.g., a regulator selection pin 410 (FIG. 4) of controller ASIC 304 is tied to a particular voltage). Then additional control logic selects the linear or capless regulator module for operations following initial power-up. In yet another embodiment the controller may be configured to select one of the linear or capless regulator modules for initial power-up as well as on-going operation based upon a configuration pin (e.g., a regulator selection pin 410 (FIG. 4) of controller ASIC 304 is tied to a particular voltage).

Referring in more detail to FIG. 4, a control logic block 408 is configured to select one of linear regulator module 402 and capless regulator module 406. This may be responsive to a hard programmed voltage value on the regulator selection pin 410 or a soft-programmed voltage value on regulator selection pin 410. Configuration registers 412 (which may be implemented in the controller or in flash memory array 302) may store information which may be used to determine an initial selection of one of the two regulator modules (and/or low or high power settings of those modules) and/or an after initial power-up selection of one of the two regulator modules (and/or low- or high-power sub-modules of those modules).

In one embodiment since the capless regulator module is stable without external capacitance by default (since it is designed that way), it is automatically selected to initially power the ASIC controller during power-up unless overridden (e.g., by the regulator select pin 410). Once the ASIC controller core voltage is established, a configuration bit may be loaded from the configuration registers 412 by firmware operating controller 304 to select one of the two regulator modules (e.g., by turning one on while turning the other off).

If a capless regulator is used in the product, only internal capacitance is present which is on the order of about 0.5 nF to a few nF (nanofarads). On the other hand, a much larger capacitance on the order of one microfarad will be present if the linear regulator is configured for use in the product (with the presence of an external capacitance). The range of potential capacitance values is then on the order of 200× or more. If not controlled, this means that the slew rate of the core voltage will vary by the same wide margin. It is possible that in one worst case the voltage could ramp up on the order of nanoseconds, triggering an ESD (electrostatic discharge) protection (clamp) device which could effectively prevent the controller from powering up. Alternatively, in another worst case if the ramp rate is too slow, specified minimum thresholds for product wake-up might be violated leading the host to conclude that the device is inoperative. This is solved in one embodiment by using by default the low-power sub-module 602 of the capless regulator module 402 (which avoids an ESD clamp) unless overridden by one of the techniques discussed above (where the circuitry is empirically determined to ramp too slowly with the low-power sub-module 602 of the capless regulator module 402).

Figure 7:
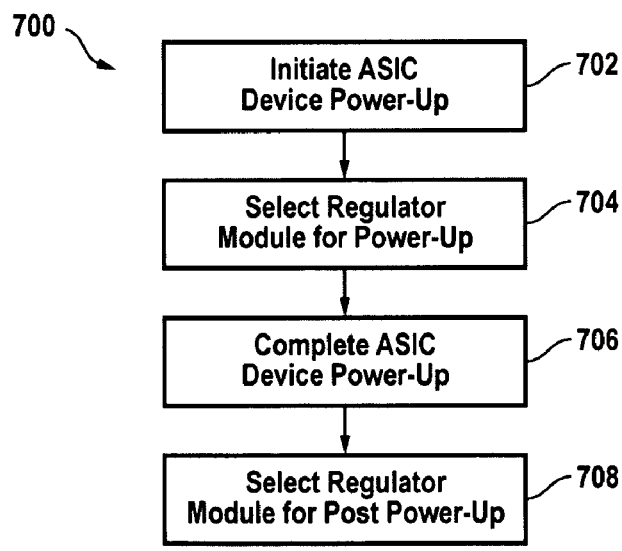
FIG. 7 is a process flow diagram illustrating a method in accordance with one embodiment.

FIG. 7 is a process flow diagram illustrating a method 700 in accordance with one embodiment. At block 702 the power-up of the ASIC device is initiated. At block 704 a regulator module for use during the power-up phase is selected as discussed in more detail above. At block 706 the ASIC device completes its power-up phase—this is accomplished when the core ASIC voltage stabilizes after power-up. At block 708 a regulator module for use during the post-power-up phase is selected as discussed in more detail above.

Accordingly, a single ASIC device may now be fabricated and used in a wider array of products increasing its utility and decreasing overall development and per-part costs.

While embodiments and applications have been shown and described, it would be apparent to those skilled in the art having the benefit of this disclosure that many more modifications than mentioned above are possible without departing from the inventive concepts disclosed herein. For example, additional regulators beyond two may be provided and employed. The invention, therefore, is not to be restricted except in the spirit of the appended claims.

What is claimed is:

1. An electronic apparatus, comprising:
   an application specific semiconductor chip (ASIC) device;
   a linear regulator module configured to be optionally coupled in operation to an external-to-the ASIC device capacitor via a node;
   a capless regulator module coupled to internal capacitance of the ASIC device via the node; and
   control logic executable by the ASIC device, the control logic responsive to a regulator selection signal for selecting one of the linear regulator module and the capless regulator module for use in powering the ASIC device.

2. The apparatus of claim 1, wherein the linear regulator module includes at least a first and a second linear regulator sub-module, the first linear regulator sub-module configured to provide up to a first level of electrical current and the second linear regulator sub-module configured to provide up to a second level of electrical current.

3. The apparatus of claim 2, wherein the second level of electrical current is greater than the first level of electrical current.

4. The apparatus of claim 1, wherein the regulator selection signal is communicated to the control logic with a regulator selection pin.

5. The apparatus of claim 4, wherein the regulator selection signal is permanently fixed to a particular voltage level.

6. The apparatus of claim 1, wherein the ASIC device is initially configured to use a default selection of one of the linear regulator module and the capless regulator module prior to the completion of initial power-up of at least a portion the ASIC device.

7. The apparatus of claim 6, wherein the linear regulator module includes at least a first and a second linear regulator sub-module, the first linear regulator sub-module configured to provide up to a first level of electrical current and the second linear regulator sub-module configured to provide up to a second level of electrical current.

8. The apparatus of claim 7, wherein the second level of electrical current is greater than the first level of electrical current.

9. The apparatus of claim 1, wherein the regulator selection signal is obtained from a pre-programmed configuration register accessible by the ASIC device.

10. An electronic apparatus, comprising:
    an application specific semiconductor chip (ASIC) device;
    a linear regulator module configured to be coupled in operation to an optional external capacitor via a node;
    a capless regulator module coupled to internal capacitance of the ASIC device via the node; and
    control logic executable by the ASIC device, the control logic responsive to a stored state of a configuration register accessible by the ASIC device for selecting one of the linear regulator module and the capless regulator module for use in powering the ASIC device.

11. The apparatus of claim 10, wherein the linear regulator module includes at least a first and a second linear regulator sub-module, the first linear regulator sub-module configured to provide up to a first level of electrical current and the second linear regulator sub-module configured to provide up to a second level of electrical current.

12. The apparatus of claim 11, wherein the second level of electrical current is greater than the first level of electrical current.

13. The apparatus of claim 10, wherein the regulator selection signal is communicated to the control logic with a regulator selection pin.

14. The apparatus of claim 13, wherein the regulator selection signal is permanently fixed to a particular voltage level.

15. The apparatus of claim 10, wherein the ASIC device is initially configured to use a predetermined one of the linear regulator module and the capless regulator module prior to the completion of initial power-up of at least a portion the ASIC device.

16. The apparatus of claim 15, wherein the linear regulator module includes at least a first and a second linear regulator sub-module, the first linear regulator sub-module configured to provide up to a first level of electrical current and the second linear regulator sub-module configured to provide up to a second level of electrical current.

17. The apparatus of claim 16, wherein the second level of electrical current is greater than the first level of electrical current.

18. The apparatus of claim 10, wherein the regulator selection signal is obtained from a pre-programmed configuration register accessible by the ASIC device.

19. A memory device, comprising:
    a memory array;
    an interface circuit configured to communicate with a host device;
    a controller coupled to communicate with the memory array and with the interface circuit, the controller implemented on an ASIC device, the controller including:
      a linear regulator module configured to be optionally coupled in operation to an external-to-the-ASIC device capacitor via a node;

a capless regulator module coupled to an internal capacitance of the ASIC device via the node; and control logic executable by the ASIC device, the control logic responsive to a regulator selection signal for selecting one of the linear regulator module and the capless regulator module for use in powering the ASIC device.

20. The memory device of claim 19, wherein the linear regulator module includes at least a first and a second linear regulator sub-module, the first linear regulator sub-module configured to provide up to a first level of electrical current and the second linear regulator sub-module configured to provide up to a second level of electrical current.

21. The apparatus of claim 20, wherein the second level of electrical current is greater than the first level of electrical current.

22. The apparatus of claim 19, wherein the regulator selection signal is communicated to the control logic with a regulator selection pin.

23. The apparatus of claim 22, wherein the regulator selection signal is permanently fixed to a particular voltage level.

24. The apparatus of claim 19, wherein the ASIC device is initially configured to use a default selection of one of the linear regulator module and the capless regulator module prior to the completion of initial power-up of at least a portion the ASIC device.

25. The apparatus of claim 24, wherein the linear regulator module includes at least a first and a second linear regulator sub-module, the first linear regulator sub-module configured to provide up to a first level of electrical current and the second linear regulator sub-module configured to provide up to a second level of electrical current.

26. The apparatus of claim 25, wherein the second level of electrical current is greater than the first level of electrical current.

27. The apparatus of claim 19, wherein the regulator selection signal is obtained from a pre-programmed configuration register accessible by the ASIC device.

28. A method for operating an electronic apparatus, the apparatus including an ASIC device, a linear regulator module configured to be optionally coupled to an external-to-the-ASIC device capacitor via a node and a capless regulator module coupled to an internal capacitance of the ASIC device via the node, the method comprising:

applying power to the ASIC device to initiate power-up of the ASIC device;

selecting one of the linear regulator module and the capless regulator module to provide power to the ASIC device during power-up of the ASIC device;

completing the power-up of the ASIC device; and choosing one of the linear regulator and the capless regulator module to provide power to the ASIC device after power-up of the ASIC device.

29. The method of claim 28, wherein the selecting is achieved by executing control logic in the ASIC device.

30. The method of claim 28, wherein the selecting is achieved by using a predetermined one of the linear regulator module and the capless regulator module in response to a regulator selection signal.

31. The method of claim 30, wherein the regulator selection signal is permanently fixed to a particular voltage.

32. The method of claim 30, wherein the regulator selection signal is responsive to a stored state of a configuration register accessible by the ASIC device.

33. The method of claim 28, wherein the selecting is responsive to a state of a pin coupled to the ASIC device.

34. The method of claim 28, wherein the choosing is achieved by executing control logic in the ASIC device.

35. The method of claim 34, wherein the choosing is responsive to a stored state of a configuration register accessible by the ASIC device.

36. The method of claim 34, wherein the choosing is responsive to a state of a pin coupled to the ASIC device.

37. A method for powering up an ASIC device of an electronic apparatus, the ASIC device including a linear regulator module configured to be optionally coupled in operation to an external-to-the ASIC device capacitor via a node and a capless regulator module coupled to an internal capacitance of the electronic product via the node, the method comprising:

initiating power-up of the ASIC device; selecting one of the linear regulator module and the capless regulator module for powering the ASIC device during power-up of the ASIC device;

completing the power-up of the ASIC device; and choosing one of the linear regulator module and the capless regulator module for powering the ASIC device after power-up of the ASIC device.

38. The method of claim 37, wherein the capless regulator module includes at least a first and a second capless regulator sub-module, the first capless regulator sub-module configured to provide up to a first level of electrical current and the second capless regulator sub-module configured to provide up to a second level of electrical current, and in cases where the capless regulator module is selected, the selecting further comprises:

selecting the first capless regulator sub-module of the capless regulator module for powering the ASIC device during power-up.

39. The method of claim 38, wherein the first level of electrical current is less than the second level of electrical current.

40. The method of claim 37, wherein the linear regulator module includes at least a first and a second linear regulator sub-module, the first linear regulator sub-module configured to provide up to a first level of electrical current and the second linear regulator sub-module configured to provide up to a second level of electrical current, and wherein in cases where the linear regulator module is chosen, the choosing further comprises:

choosing the first linear regulator sub-module of the linear regulator module for powering the ASIC device during power-up.

41. The method of claim 40, wherein the first level of electrical current is less than the second level of electrical current.

42. A method for operating a memory device, the memory device including a memory array, an interface circuit configured to communicate with a host device, a controller coupled to communicate with the memory array and the interface circuit, the controller implemented on an ASIC device, the controller including a linear regulator module configured to be optionally coupled in operation to an external-to-the ASIC device capacitor via a node, a capless regulator module coupled to an internal capacitance of the ASIC device via the node; and control logic executable by the ASIC device, the control logic responsive to a regulator selection signal for selecting one of the linear regulator module and the capless regulator module for use in powering the ASIC device, the method comprising:

applying power to the ASIC device to initiate power-up of the ASIC device;

selecting one of the linear regulator module and the capless regulator module to provide power to the ASIC device during power-up of the ASIC device;

completing the power-up of the ASIC device; and choosing one of the linear regulator and the capless regulator module to provide power to the ASIC device after power-up of the ASIC device.

43. The method of claim 42, wherein the linear regulator module includes at least a first and a second linear regulator sub-module, the first linear regulator sub-module is configured to provide up to a first level of electrical current and the second linear regulator sub-module is configured to provide up to a second level of electrical current.

44. The method of claim 42, wherein the selecting is achieved by executing control logic in the ASIC device.

45. The method of claim 44, wherein the regulator selection signal is responsive to a stored state of a configuration register accessible by the ASIC device.

46. The method of claim 42, wherein the selecting is achieved by using a predetermined one of the linear regulator module and the capless regulator module in response to a regulator selection signal.

47. The method of claim 44, wherein the regulator selection signal is permanently fixed to a particular voltage.

48. The method of claim 42, wherein the selecting is responsive to a state of a pin coupled to the ASIC device.

49. The method of claim 48, wherein the choosing is responsive to a state of a pin coupled to the ASIC device.

50. The method of claim 42, wherein the choosing is achieved by executing control logic in the ASIC device.

51. The method of claim 48, wherein the choosing is responsive to a stored state of a configuration register accessible by the ASIC device.

* * * * *